(12) United States Patent
Choi et al.

(10) Patent No.: US 10,466,587 B2
(45) Date of Patent: Nov. 5, 2019

(54) PRESS ROLLER AND IMPRINT METHOD USING THE SAME

(71) Applicant: Samsung Display Co., Ltd., Yongin-si (KR)

(72) Inventors: Sung-Young Choi, Hwaseong-si (KR); Minsoo Kim, Seoul (KR); Mugyeom Kim, Hwaseong-si (KR); Sungchul Kim, Seongnam-si (KR); Gug Rae Jo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 77 days.

(21) Appl. No.: 15/677,437

(22) Filed: Aug. 15, 2017

(65) Prior Publication Data

US 2018/0107109 A1   Apr. 19, 2018

(30) Foreign Application Priority Data

Oct. 14, 2016 (KR) .................. 10-2016-0133675

(51) Int. Cl.
*G03F 7/00* (2006.01)

(52) U.S. Cl.
CPC ............................. *G03F 7/0002* (2013.01)

(58) Field of Classification Search
CPC ......... G03F 7/00; G03F 7/0002; G03F 7/0017
See application file for complete search history.

(56) References Cited

U.S. PATENT DOCUMENTS

| | | | |
|---|---|---|---|
| 6,921,614 B2 | 7/2005 | Andrews et al. | |
| 2004/0164444 A1* | 8/2004 | Arrington | B29C 47/065 264/173.14 |
| 2006/0115305 A1* | 6/2006 | Lofthus | G03G 15/2007 399/328 |
| 2012/0097194 A1* | 4/2012 | McDaniel | A01N 63/02 134/26 |
| 2015/0111005 A1 | 4/2015 | Hosomi et al. | |
| 2015/0314323 A1 | 11/2015 | Park et al. | |
| 2016/0187822 A1* | 6/2016 | Fukuhata | G03G 15/2064 399/329 |

FOREIGN PATENT DOCUMENTS

| | | |
|---|---|---|
| KR | 10-2015-0041161 | 4/2015 |
| KR | 10-2015-0126758 | 11/2015 |

* cited by examiner

*Primary Examiner* — David H Banh
(74) *Attorney, Agent, or Firm* — H.C. Park & Associates, PLC

(57) ABSTRACT

A press roller for imprint method including: a roller body having a cylindrical shape extending in a first direction; an energy generating part disposed on a curved surface of the roller body, the energy generating part including a plurality of energy generating units configured to be individually controlled to emit energy; and a compensation layer disposed on the energy generating part, the compensation layer including a material that expands in volume when the energy is applied.

18 Claims, 23 Drawing Sheets

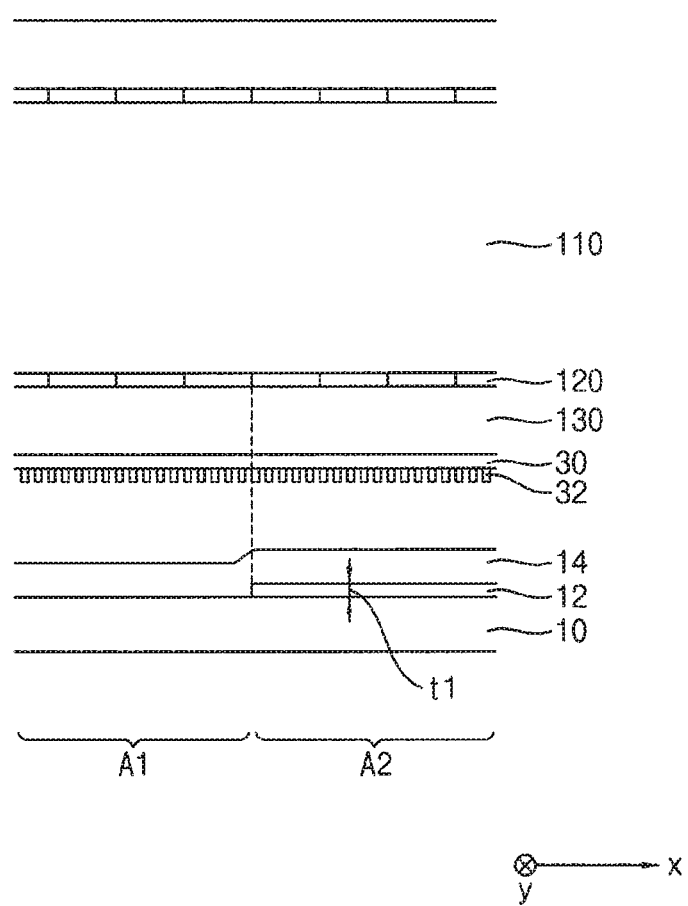

PRESS ROLLER AND IMPRINT METHOD USING THE SAME

CROSS-REFERENCE TO RELATED APPLICATION

This application claims priority from and the benefit of Korean Patent Application No. 10-2016-0133675, filed on Oct. 14, 2016, which is hereby incorporated by reference for all purposes as if fully set forth herein.

BACKGROUND

Field

Exemplary embodiments relate to a press roller for an imprint method, and an imprint method using the press roller. More particularly, exemplary embodiments relate to a press roller for an imprint method for forming a resin pattern using a stamp, and an imprint method using the press roller.

Discussion of the Background

Recently, use of a nano-imprint lithography for forming a fine pattern has been researched. For example, a liquid crystal display apparatus may include a wire grid polarizer. A resin layer is formed on a metal layer of a substrate, and then an imprint pattern is formed on the resin layer by imprinting a stamp by imprinting a stamp onto the resin layer, and then the metal layer is patterned into wire gird polarizer by patterning the metal layer using the imprinted resin layer as a mask.

However, according to the conventional imprint method, when an upper surface of the substrate, on which the resin layer is formed and the imprint method is processed, is not even, a residual layer at the stepped portion may be formed in an uneven manner, including a portion formed thicker than another portion, or the imprint pattern may be inaccurately formed, and the quality of the imprint method may be deteriorated.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a press roller for an imprint method which is capable of improving imprint quality when a surface on which an imprint pattern is formed has a stepped portion.

Exemplary embodiments also provide an imprint method using the press roller.

Additional aspects will be set forth in the detailed description which follows, and, in part, will be apparent from the disclosure, or may be learned by practice of the inventive concepts.

According to an exemplary embodiment, a press roller for an imprint method may include: a roller body having a cylindrical shape extending in a first direction; an energy generating part disposed on a curved surface of the roller body, the energy generating part including a plurality of energy generating units configured to be individually controlled to emit energy; and a compensation layer disposed on the energy generating part, the compensation layer including a material that expands in volume when the energy is applied.

The compensation layer may include a first polymeric binder and a second polymeric binder, and wherein a first glass transition temperature of the first polymeric binder is at least 20 centigrade degrees higher than a second glass transition temperature of the second polymeric binder.

The first polymeric binder may include at least one selected from a group consisting of polystyrene and copolymers thereof, acrylates, methacrylates and copolymers thereof, and wherein the second polymeric binder may include at least one selected from a group consisting of butyl acrylates and copolymers thereof.

The plurality of energy generating units may be configured to generate heat or microwaves.

The plurality of energy generating units may be arranged in the first direction, and wherein each of the plurality of energy generating units extends along the curved surface in a second direction perpendicular to the first direction.

Each of the plurality of energy generating units may be arranged in a matrix form on the curved surface in the first direction and a direction perpendicular to the first direction.

The press roller may further include a protecting layer disposed on the compensation layer to protect the compensation layer.

According to an exemplary embodiment, an imprint method may include: providing a substrate including a pattern disposed thereon, the substrate having a stepped portion in an upper surface formed by the pattern; disposing a resin layer on the substrate; providing a press roller, a film, and a stamp disposed on the film, the press roller including a roller body having a cylindrical shape extending in a first direction, an energy generating part disposed on a curved surface of the roller body, and a compensation layer disposed on the energy generating part, wherein the energy generating part may include a plurality of energy generating units configured to be individually controlled to emit energy and the compensation layer may include material that expands in volume when the energy is applied; controlling a thickness of a portion of the compensation layer by operating the plurality of energy generating units; forming an imprint pattern by pressing the stamp onto the resin layer using the press roller; and separating the stamp from the resin layer.

The compensation layer may include a first polymeric binder and a second polymeric binder, and wherein a first glass transition temperature of the first polymeric binder may be at least 20 centigrade degrees higher than a second glass transition temperature of the second polymeric binder.

The first polymeric binder may include at least one selected from a group consisting of polystyrene and copolymers thereof, acrylates, methacrylates and co-polymers thereof, and wherein the second polymeric binder may include at least one selected from a group consisting of butyl acrylates and co-polymers thereof.

The plurality of energy generating units may be arranged in the first direction, and wherein each of the plurality of energy generating units extends along the curved surface in a second direction perpendicular to the first direction.

The stepped portion of the substrate may extend in the second direction.

The substrate may include a first area in which the pattern is not formed, and a second area in which the pattern is formed, and wherein the pattern has a first thickness, wherein the controlling the thickness of the portion of the compensation may include: controlling a thickness of a first portion of the compensation layer corresponding to the first area to be thicker by the first thickness than a thickness of a second portion of the compensation layer corresponding to the second area.

The substrate may further include a third area in which the pattern is not formed, the second area is disposed between the first area and the third area, wherein the controlling the thickness of the portion of the compensation may further include controlling a thickness of a third portion of the compensation layer corresponding to the third area to be thicker by the first thickness than the thickness of the second portion of the compensation layer corresponding to the second and third area.

The plurality of energy generating units may be arranged in a matrix form on the curved surface in the first direction and a second direction perpendicular to the first direction.

The stepped portion may extend in the first direction.

The substrate may include a first area in which the pattern is not formed, and a second area in which the pattern is formed, and wherein the pattern has a first thickness, wherein the controlling the thickness of the portion of the compensation may include: controlling a thickness of a first portion of the compensation layer corresponding to the first area to be thicker by the first thickness than a thickness of a second portion of the compensation layer corresponding to the second area.

The pattern may include a first pattern portion having a first thickness, and a second pattern portion having a second thickness, wherein the controlling the thickness of the portion of the compensation may include: controlling the compensation layer to have various thicknesses corresponding to the stepped portion formed by the first pattern portion and the second pattern portion.

According to an exemplary embodiment of the inventive concept, an imprint method may include: disposing a resin layer on a substrate, the resin layer including a pattern forming a stepped portion on a upper surface of the substrate; and forming an imprint pattern on the resin layer by pressing a stamp disposed on a film using a press roller, wherein the press roller may include an energy generating part including a plurality of energy generating units configured to be individually controlled, and a compensation layer disposed on the energy generating part, the compensation layer including a material that expands in volume when energy is applied thereto.

The imprint method may further include: controlling a thickness of at least a portion of the compensation to have various thicknesses corresponding to the stepped portion formed by the pattern.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 4A, 4B, and 4C are cross-sectional views taken along a sectional line I-I' of FIG. 3, illustrating forming an imprint pattern on the substrate of FIG. 3 using the imprint method.

DETAILED DESCRIPTION OF THE ILLUSTRATED EMBODIMENTS

Figure 1A:
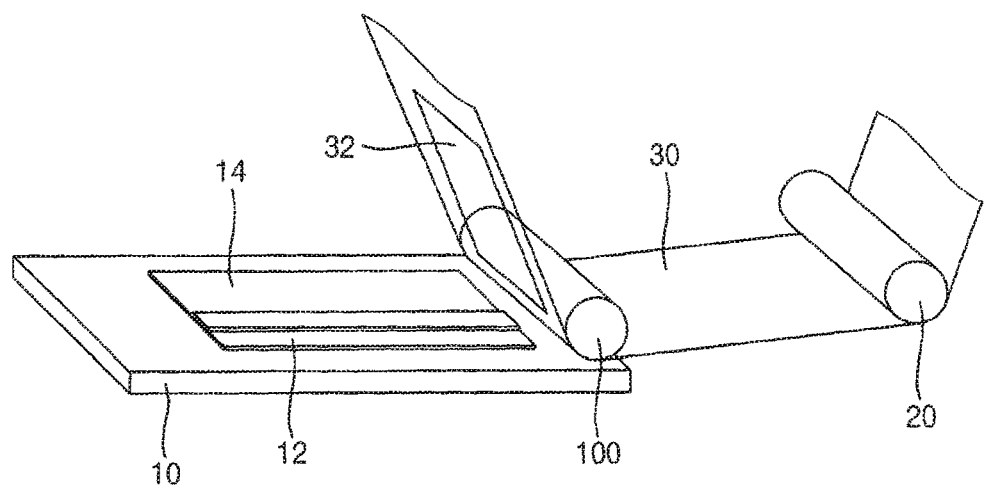
FIGS. 1A, 1B, and 1C are perspective views illustrating an imprint method according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
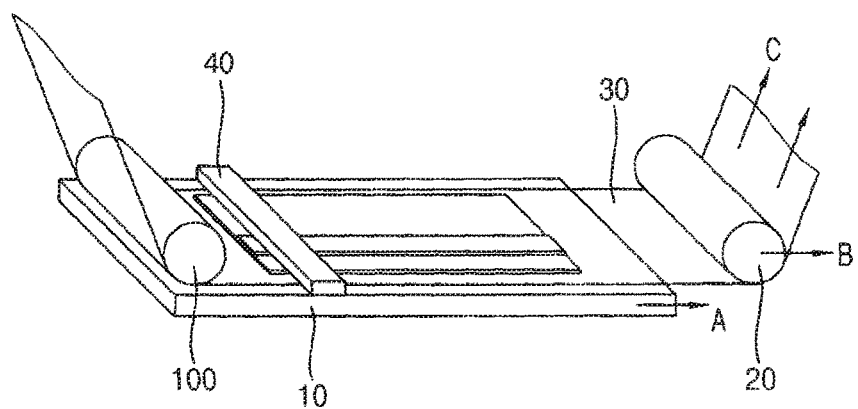
Figure 1C:
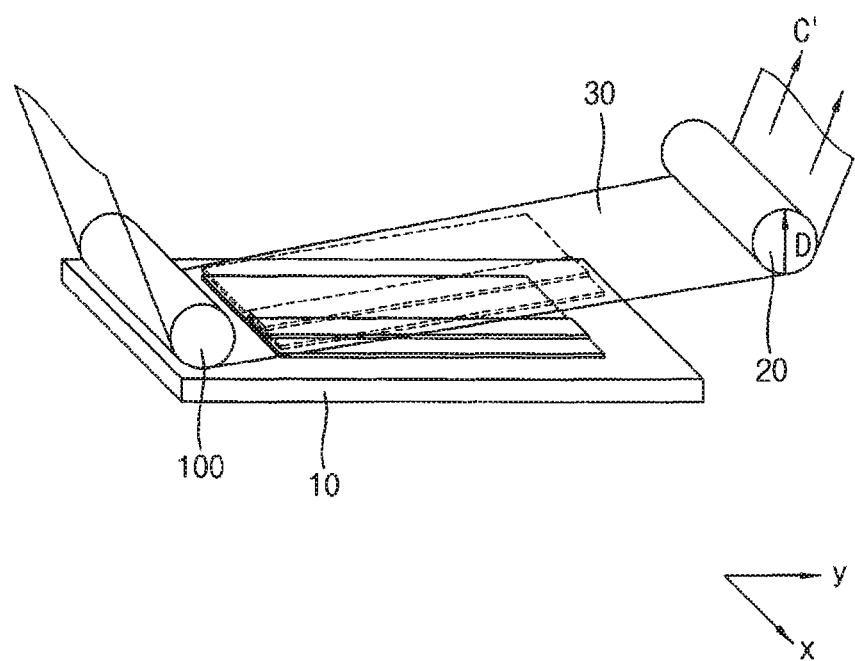

FIGS. 1A, 1B, and 1C are cross-sectional views illustrating an imprint method according to an exemplary embodiment.

Referring to FIG. 1A, a substrate 10 may be provided. A pattern 12 may be formed on the substrate 10. A resin layer 14 may be coated on the substrate 10 on which the pattern 12 is formed. By the pattern 12, a stepped portion may be formed on an upper surface of the substrate 10 in an area where the resin layer 14 is coated.

An imprint device may be provided on the substrate 10. The imprint device may include a press roller 100, a de-molding roller 20, a film 30 and a stamp 32. The press roller 100 may include a roller body which extends in a first direction x and has a cylindrical shape. The de-molding roller 20 may have a roller body which is spaced apart from the press roller 100 in a second direction y, extends in the first direction x, and has a cylindrical shape. The second direction y may be substantially perpendicular to the first direction x. The film 30 may be guided by the press roller 100 and the de-molding roller 20. A stamp 32 may be formed on the film 30 to form an imprint pattern.

Referring to FIG. 1B, as the substrate 10 moves along the second direction y (refers to an arrow A in the figure) and the press roller 100 and the de-molding roller 20 rotates, the imprint pattern may be formed on the resin layer 14 by the stamp 32. Here, the press roller 100 may press the film 30 onto the substrate 10 and rotates, so that the stamp 32 may be pressed onto the resin layer 14. As the de-molding roller 20 moves in the second direction y (refers to an arrow B in a figure), and the film 30 moves in a direction away from the substrate 10 (refers to an arrow C in the figure), tension applied to the film 30 can be maintained. The resin layer 14 on which the imprint pattern is formed may be hardened or cured by radiating ultraviolet ray generated by an ultraviolet ray irradiator 40. Here, the film 30 and the stamp may pass or transmit through light, so that the ultraviolet ray generated by the ultraviolet ray irradiator 40 may be radiated onto the resin layer 14 through the film 30 and the stamp 32.

Here, to prevent or reduce imprint defect due to a stepped portion formed by the pattern 12 on the substrate 10, thickness of a compensation layer included in the press roller 100 may be controlled. A detailed description thereof will be described later.

Referring to FIG. 1C, as the de-molding roller 20 moves away from the substrate 10 (refers to an arrow D in the figure), and the film 30 moves away from the substrate 10 (refers to an arrow C' in the figure), the stamp 32 can be separated from the resin layer 14 on which the imprint pattern is formed.

Accordingly, the resin layer 14 on which the imprint pattern is formed may be formed on the substrate 10. After performing a subsequent process such as removing a residual layer of the resin layer 14, a patterning process may be performed to form a fine pattern.

Figure 2A:
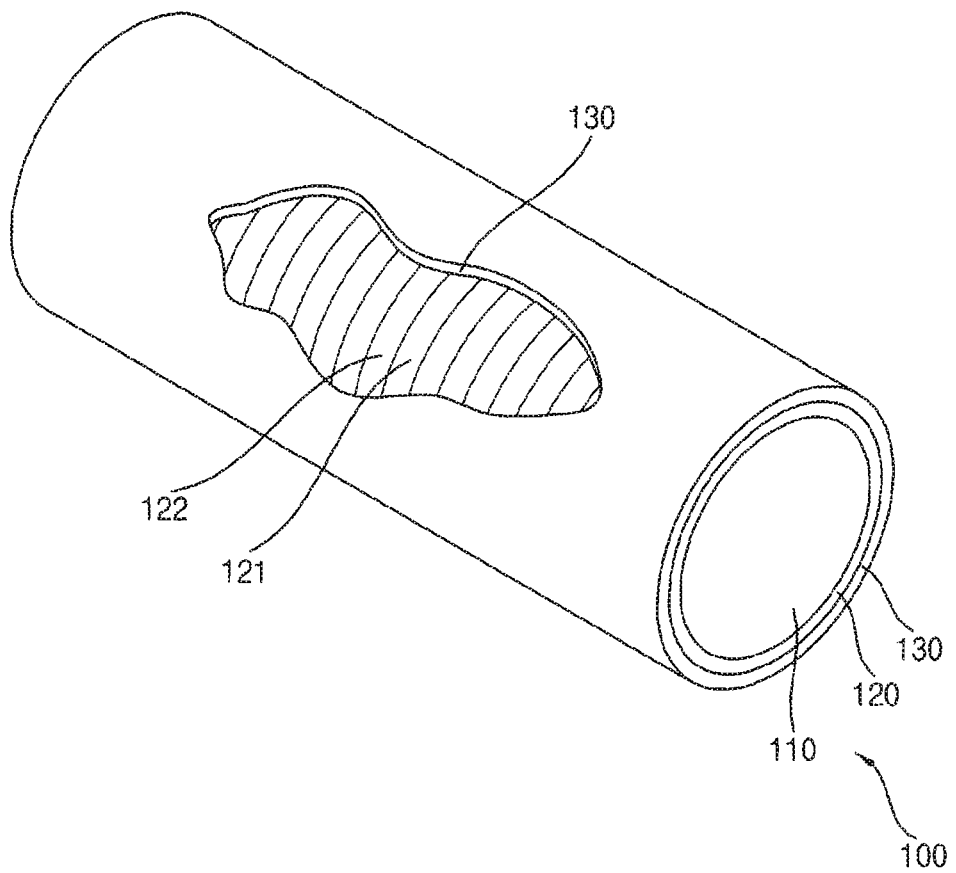
FIGS. 2A, 2B, and 2C are perspective views of press rollers for an imprint method according to exemplary embodiments.
Figure 2B:
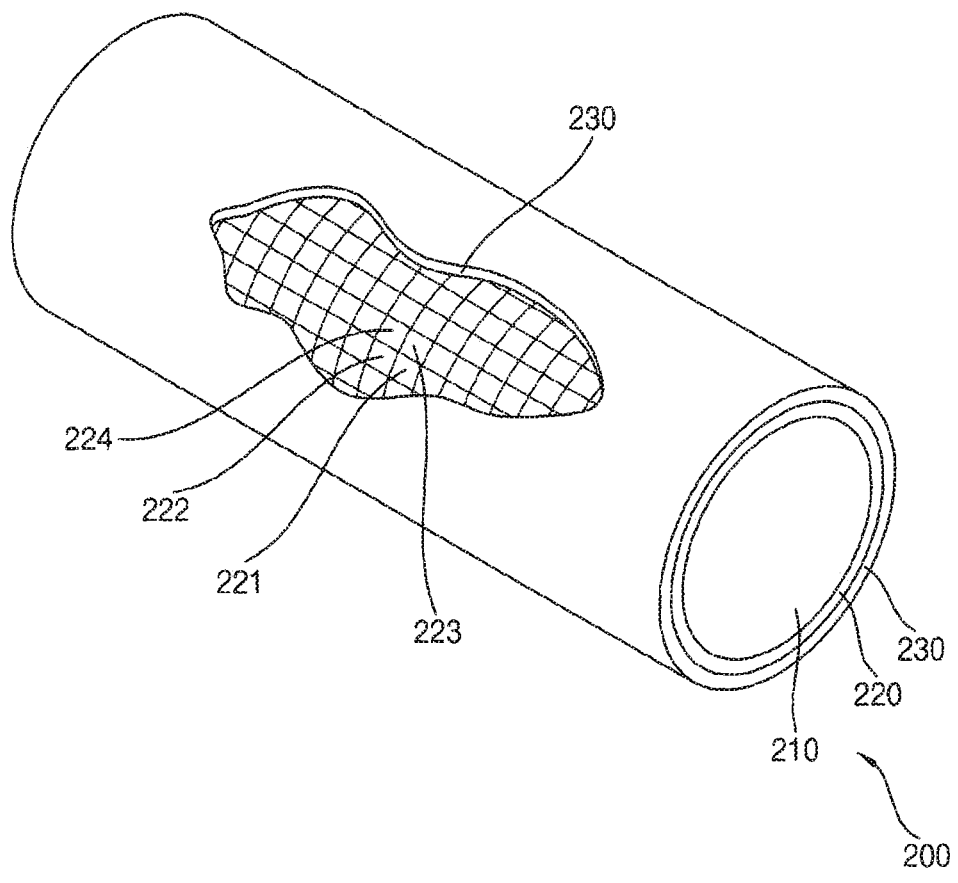
Figure 2C:
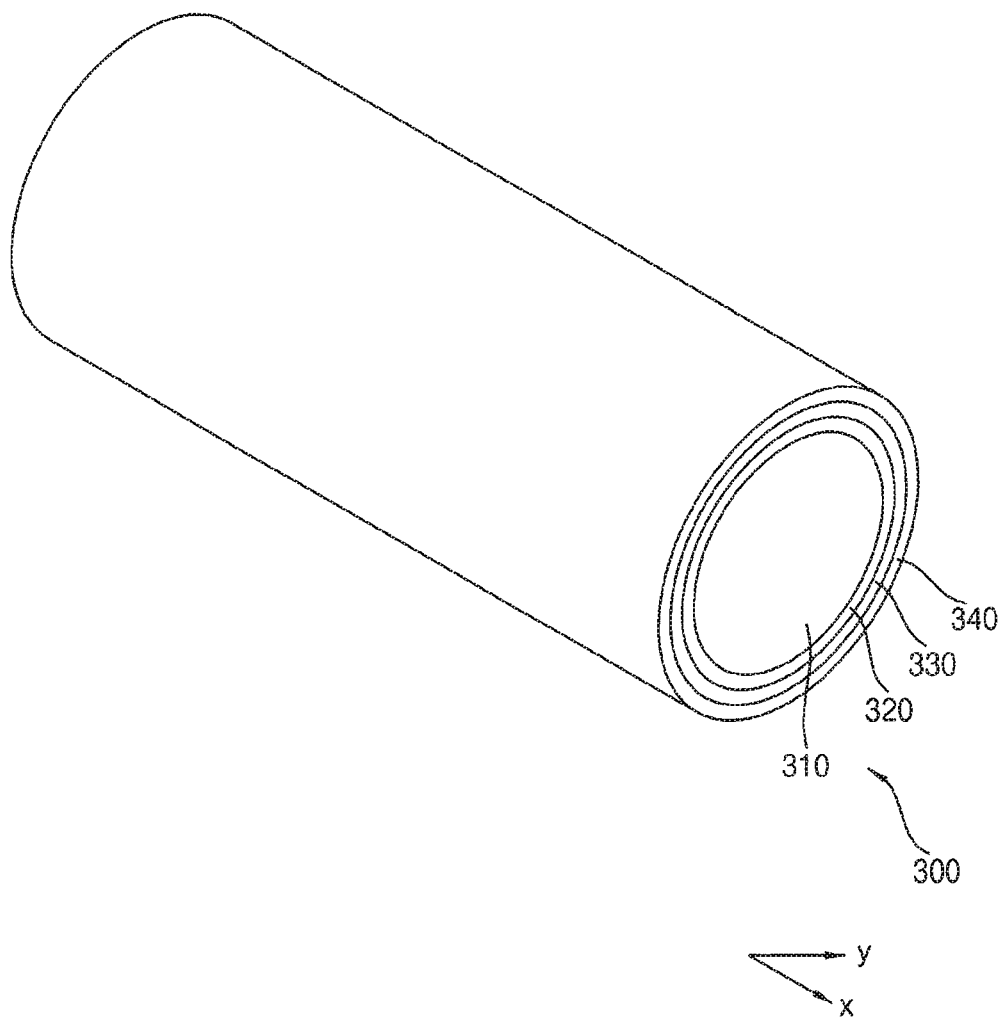

FIGS. 2A, 2B, and 2C are perspective views of press rollers for an imprint method according to an exemplary embodiment.

Referring to FIG. 2A, the press roller 100 may include a roller body 110, an energy generating part 120 and a compensation layer 130.

The roller body 110 may have a cylindrical shape extending in a first direction x.

The energy generating part 120 may be disposed on a curved surface of the roller body 110. The energy generating part 120 may include a plurality of energy generating units arranged along the first direction x. For example, the energy generating part 120 may include a first energy generating unit 121 and a second energy generating unit 122 disposed adjacent to the first energy generating unit 121 in the first direction x. Each of the first energy generating unit 121 and the second energy generating unit 122 may have a ring shape which surrounds the roller body 110.

Each of the energy generating units of the energy generating part 120 may be individually controlled. The energy generating units may include a heat generator to heat corresponding portions of the compensation layer 130.

Thus, heating temperature of the first energy generating unit 121 and heating temperature of the second energy generating unit 122 can be individually controlled. Accordingly, the corresponding portions of the compensation layer 130 which correspond to each of the energy generating units can be individually heated.

According to an exemplary embodiment, the energy generating units of the energy generating part 120 may include means for supplying energy to a corresponding portion of the compensation layer 130. For example, the energy generating units may include a microwave generator to provide a microwave to the corresponding portion of the compensation layer 130.

The compensation layer 130 may be disposed on the energy generating part 120, and surround the press roller 100.

The compensation layer 130 may include a material that expands in volume in response to heat (or energy) is applied thereto. Thus, when heat (or energy) is applied to a portion of the compensation layer 130, the thickness of the portion applied with the heat may become thicker than the other portion. When the portion is cooled, the thickness may return to its original state. The thickness may be controlled in response to an intensity of the applied heat. The energy generating units of the energy generating part 120 may be individually controlled, so that the thickness of the compensation layer 130 may also be variously and individually adjusted corresponding to an arrangement of the energy generating units.

Exemplary material constituting the compensation layer 130 may include, for example, the material constituting the transfer layer of U.S. Pat. No. 6,921,614, which is hereby incorporated by reference for all purposes as if fully set forth herein.

More particularly, the compensation layer 130 may include at least two or more polymeric binders including at least one pair of the binders having deviation in glass transition temperature (Tg) by at least 20 centigrade degrees.

Binder polymers having a high Tg may include, but are not limited to, polystyrene and copolymers thereof, acrylates, methacrylates and co-polymers thereof. Binder polymers having a low Tg may include but are not limited to butyl acrylates and co-polymers thereof. The monomer units present in the polymeric binders suitable for use in the present invention may be either substituted or unsubstituted, and mixtures of the binding polymers can also be used.

According to an exemplary embodiment, substantially between 1 mole % to 5 mole % of a crosslinkable monomer may be incorporated into the polymeric binders. The crosslinkable comonomers may include, but are not limited to, hydroxy ethyl methacrylate and glycidyl methacrylate.

The polymeric binders included in the present invention are present at a concentration of substantially between 15 to 50% by weight, preferably substantially between 30 to 40% by weight, based on the total weight of the compensation layer 130. The weight ratio of higher Tg binder to lower Tg binder should be in the range of 60:40 to 95:5.

The polymeric binders according to the exemplary embodiments may be incorporated as a whole, and may be synthesized in the form of latex dispersions, as described in Mazur et al, U.S. Pat. No. 6,020,416, which is hereby incorporated by reference for all purposes as if fully set forth herein. The synthesis of polymer latexes is a well-known art widely in commercial use.

According to an exemplary embodiment, at least one of the polymeric binders may include a monomer including pendant groups which may form a free-radical induced crosslinking reaction or a cationic reaction. Pendant groups which may form the free-radical induced crosslinking reactions may include an ethylenically unsaturation parts, such as mono- and poly-unsaturated alkyl groups, acrylic acid, methacrylic acid, and esters. According to exemplary embodiments, the pendant crosslinking group may be photosensitive, such as pendant cinnamoyl or N-alkyl stilbazolium groups. Pendant groups which may form the cationic crosslinking reaction may include substituted and unsubstituted epoxide group and aziridine group.

According to the exemplary embodiments, the crosslinkable binders may be formed by a direct copolymerization of at least one of ethylenically unsaturated dicarboxylic acid anhydrides or alkyl diesters corresponding thereto, with one or more of the comonomers. The ethylenically unsaturated dicarboxylic acid anhydrides may include, for example, maleic anhydride, itaconic acid anhydride and citraconic acid anhydride and alkyl diesters such as the diisobutyl ester of maleic anhydride. The copolymer binder containing acid anhydride functionality can react with primary aliphatic or aromatic amines.

According to the exemplary embodiments, any material may be included as additives in the transfer layer as long as they do not interfere with the function of the compensation layer 130. The additives may include coating aids, plasticizers, flow additives, slip agents, antihalation agents, antistatic agents, surfactants, and others material which may be known to be used in the formulation of coatings.

The compensation layer 130 may be formed as a single layer, or may be composed of a plurality of layers.

The compensation layer 130 can be coated onto the energy generating part 120 by a dispersion in a suitable solvent, however, the exemplary embodiments are not limited there to, and the compensation layer 130 may be coated onto the energy generating part 120 using any conventional coating techniques or printing techniques, for example, gravure printing using a solution. Any suitable solvent can be used as a coating solvent, as long as it does not have deteriorating effect on the properties of the compensation layer 130.

According to the exemplary embodiment, the press roller 100 may compensate for the step difference formed in the first direction x of an imprint area.

Referring to FIG. 2B, the press roller 200 may include a roller body 210, an energy generating part 220 and a compensation layer 230. The press roller 200 may be substantially same as the press roller 100 of FIG. 2A, except for the energy generating part 220. Thus, detailed descriptions concerning the substantially same elements will be omitted.

The energy generating part 220 may be disposed on a curved surface of the roller body 210. The energy generating part 220 may include a plurality of energy generating units arranged in a matrix form along a first direction x and a curved direction perpendicular to the first direction x. For example, the energy generating part 120 may include a first energy generating unit 221, a second energy generating unit 222 disposed adjacent to the first energy generating unit 221 in the first direction x, a third energy generating unit 223 disposed adjacent to the first energy generating unit 221 in the curved direction, and a fourth energy generating unit 224 disposed adjacent to the second energy generating unit 222 in the curved direction and adjacent to the third energy generating unit 223 in the first direction x. Each of the first, second, third, and fourth energy generating units 221, 222, 223, and 224 may be arranged in a matrix form with a rectangular shape.

Each of the energy generating units of the energy generating part 220 may be individually controlled. The energy generating units may include heat generator to heat corresponding portions of the compensation layer 230.

Thus, heating temperature of the first energy generating unit 221, heating temperature of the second energy generating unit 222, heating temperature of the third energy generating unit 223 and heating temperature of the fourth energy generating unit 224 can be individually controlled. Accordingly, the corresponding portions of the compensation layer 230 which correspond to each of the energy generating units can be individually heated.

According to an exemplary embodiment, the energy generating units of the energy generating part 220 may include means for supplying energy to a corresponding portion of the compensation layer 230. For example, the energy generating units may include a microwave generator to provide a microwave to the corresponding portion of the compensation layer 230.

According to the exemplary embodiment, the press roller 200 may compensate for the step difference formed in the first direction x and the second direction y which is perpendicular to the first direction x.

Referring to FIG. 2C, the press roller 300 may include a roller body 310, an energy generating part 320, a compensation layer 330, and a protecting layer 340. The press roller 300 may be substantially same as the press roller 100 or 200 of FIG. 2A or 2B, except that the press roller 300 further includes the protecting layer 340. Thus, detailed descriptions concerning the substantially same elements will be omitted.

The protecting layer 340 may be formed on the compensation layer 330 to protect the compensation layer 330. In addition, the protecting layer 340 may have elasticity to prevent or reduce unwanted deformation during controlling the thickness of the compensation layer 330. In addition, the protecting layer 340 may protect the compensation layer 330 and the energy generating part 320 from external static electricity.

Figure 3:
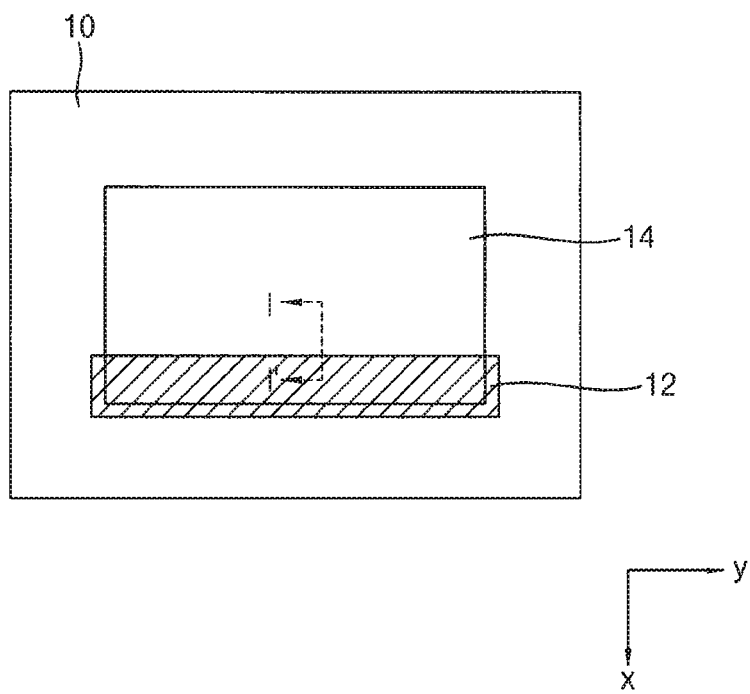
FIG. 3 is a plan view of a substrate for an imprint method according to an exemplary embodiment.
Figure 4B:
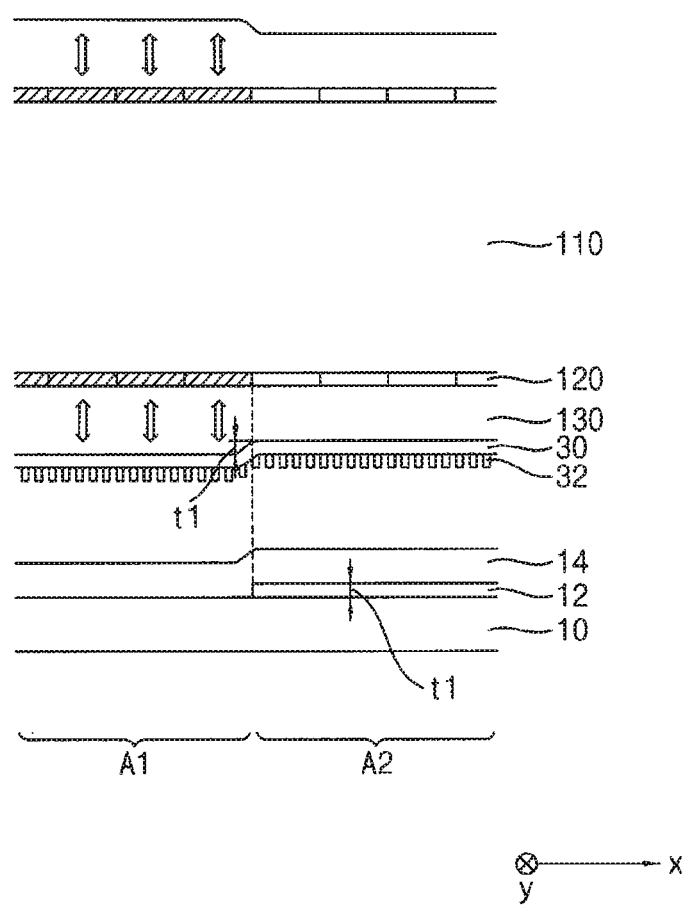
Figure 4C:
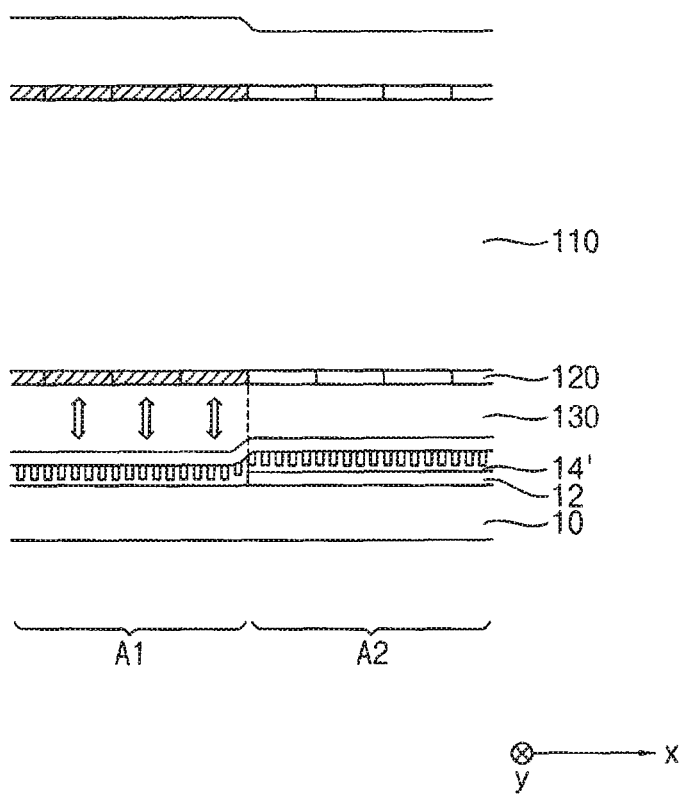

FIG. 3 is a plan view of a substrate for an imprint method according to an exemplary embodiment. FIGS. 4A, 4B, and 4C are cross-sectional views taken along a sectional line I-I' of FIG. 3, illustrating forming an imprint pattern on the substrate of FIG. 3 using the imprint method.

Referring to FIGS. 3 and 4A, a pattern 12 may be formed on a substrate 10. The pattern 12 may have a first thickness t1, and a stepped portion may be formed on the substrate 10. A resin layer 14 may be formed on the substrate 10 on which the pattern 12 is formed. The resin layer 14 may be disposed in a second area A2 and a first area A1 which is adjacent to the first area A1.

An imprint device which includes a press roller (refers to 100 of FIG. 2A), a film 30, and a stamp 32 is provided onto the substrate 10 on which the pattern 12 and the resin layer 14 are disposed. The press roller may include a roller body 110, an energy generating part 120 including first and second energy generating units 121 and 122, and a compensation layer 130.

Referring to FIG. 4B, by operating the energy generating part 120, thickness of a portion of the compensation layer 130 may be controlled. Accordingly, the thickness of the energy generating units of the energy generating part 120 (not shaded areas of the energy generating part 120 illustrated in FIG. 4B) contacting to a second portion of the compensation layer 130 corresponding to the second area A2 in which the pattern 12 is formed, may be maintained. Also, energy generating units of the energy generating part 120 (shaded areas of the energy generating part 120 illustrated in FIG. 4B) corresponding to a first portion of the compensation layer 130 corresponding to the first area A1 in which the pattern 12 is not disposed, may heat up (or generate energy, such as microwave), so that heat or energy may be provided to the first portion of the compensation layer 130. Accordingly, thickness of the first portion of the compensation layer 130 in the first area A1 may be increased to compensate for the first thickness t1.

Here, changed thickness of the compensation layer 130 in the first portion, may be same as thickness of the pattern 12, the first thickness t1, by controlling the energy generating units.

Thus, when the stepped portion due to the pattern 12 is formed on an upper surface of the substrate 10 on which the resin layer 14 is formed, the thickness of the compensation layer 130 can be actively controlled corresponding to the stepped portion.

Referring to FIG. 4C, an imprint pattern may be imprinted onto the resin layer 14 by pressing the stamp 32 onto the resin layer 14 using the press roller 100.

Here, the thickness of the compensation layer 130 is variously deformed corresponding to the stepped portion of the substrate 10, so that the stamp 32 may uniformly press the resin layer 14. Accordingly, imprint defect that may occur due to the stepped portion at a boundary between the first area A1 and the second area A2 can be minimized or reduced.

In addition, ultraviolet ray is radiated to the resin layer 14' including the imprint pattern imprinted, and then the stamp 32 may be separated from the resin layer 14'. Subsequently, any subsequent process may be performed to complete an imprint lithography process.

Figure 5:
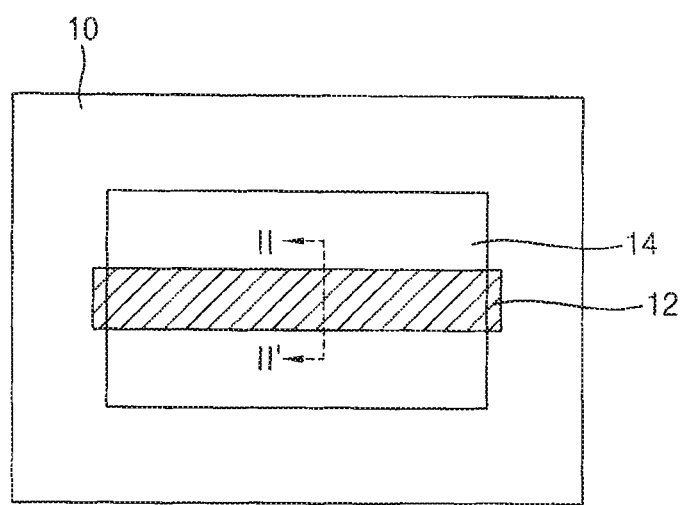
FIG. 5 is a plan view of a substrate for an imprint method according to an exemplary embodiment.
Figure 5:
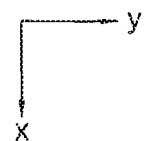
Figure 6A:
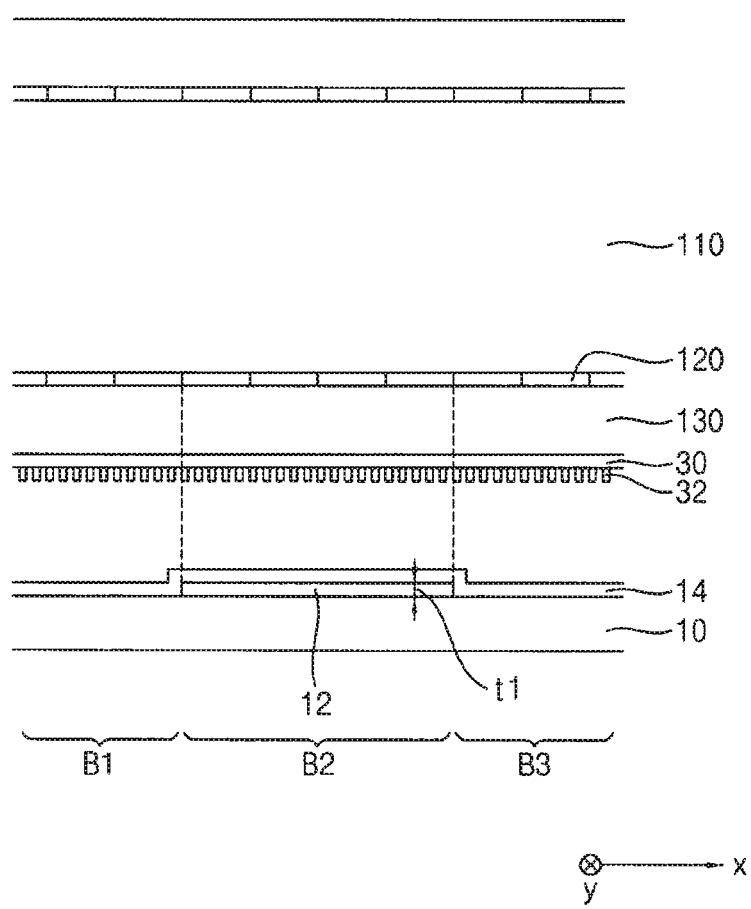
FIGS. 6A, 6B, and 6C are cross-sectional views taken along a sectional line II-II' of FIG. 5 illustrating forming an imprint pattern on the substrate of FIG. 5 using the imprint method.
Figure 6B:
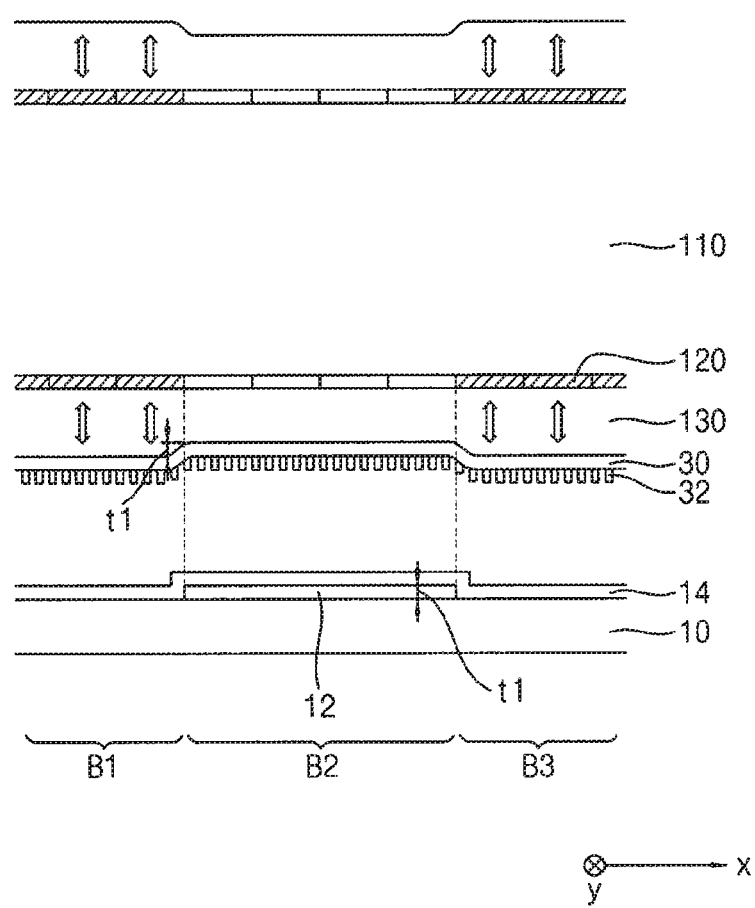
Figure 6C:
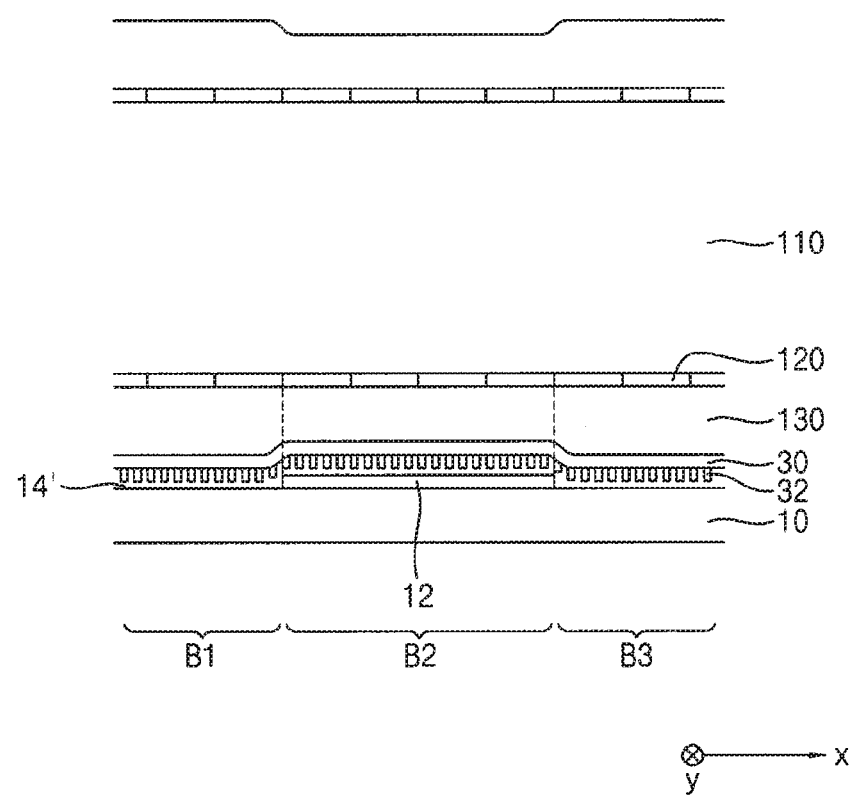

FIG. 5 is a plan view of a substrate for an imprint method according to an exemplary embodiment. FIGS. 6A, 6B, and 6C are cross-sectional views taken along a sectional line II-II' of FIG. 5, illustrating forming an imprint pattern on the substrate of FIG. 5 using the imprint method. The imprint method may be substantially the same as the imprint method of FIGS. 3, 4A, 4B, and 4C, except for a position of a stepped portion of the substrate. Thus, any further detailed descriptions concerning the same elements will be omitted.

Referring to FIGS. 5 and 6A, a pattern 12 may be formed on a substrate 10. The pattern 12 may have a first thickness t1. Thus, a stepped portion may be formed on an upper surface of the substrate 10. A resin layer 14 may be disposed on the substrate 10 on which the pattern 12 is formed. The resin layer 14 may be disposed in a second area B2 in which the pattern 12 is formed, and a first area B1 and third area B3 which are adjacent to the second area B2.

Referring to FIG. 6B, by operating the energy generating part 120, thickness of a portion of a compensation layer 130 may be controlled. According to the exemplary embodiment, the energy generating units of the energy generating part 120 contacting to a second portion of the compensation layer 130 corresponding to the second area B2 in which the pattern 12 is formed, may not generate heat (or not generate microwave), so that the thickness of the portion of the compensation layer 130 corresponding to the second area B2 may be maintained without changing. Also, energy generating units of the energy generating part 120 (shaded areas on the picture) which correspond to a first portion and a third portion of the compensation layer 130 that is corresponding to the first area B1 and the third area B3 in which the pattern 12 is not formed, may generate heat (or generate microwave), so that the heat or energy may be provided to the first portion and the third portion of the compensation layer 130. Accordingly, thickness of the first portion and the third portion of the compensation layer 130 in the first area B1 and the third area B3 may be increased by the first thickness t1.

Referring to FIG. 6C, an imprint pattern may be imprinted onto the resin layer 14 by pressing the stamp 32 onto the resin layer 14 using the press roller 100.

Here, the thickness of the compensation layer 130 is variously deformed corresponding to the stepped portion of the substrate 10, so that the stamp 32 may uniformly press the resin layer 14. Accordingly, imprint defect that may occur due to the stepped portion at a boundary between the first area B1 and the second area B2 and at a boundary between the second area B2 and the third area B3 can be minimized or reduced.

Figure 7:
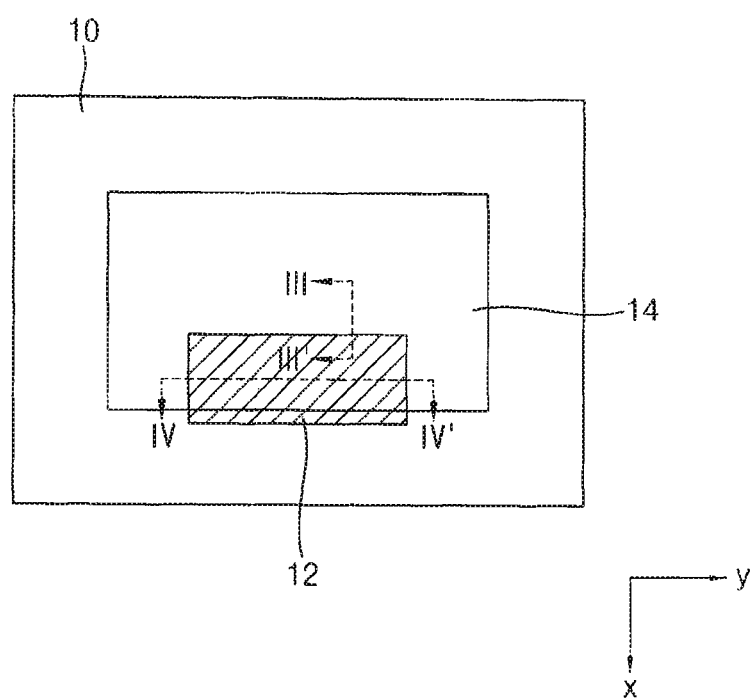
FIG. 7 is a plan view of a substrate for an imprint method according to an exemplary embodiment.

FIG. 7 is a plan view of a substrate for an imprint method according to an exemplary embodiment. FIGS. 8A, 8B, 8C, 8D, and 8E are cross-sectional views taken along sectional lines III-III' and IV-IV' of FIG. 5 illustrating forming an imprint pattern on the substrate of FIG. 7 using the imprint method. More specifically, FIGS. 8A, 8B, 8D, and 8E are cross-sectional views taken along the sectional line IV-IV' of FIG. 5, and FIG. 8C is a cross-sectional view taken along the sectional line III-III' of FIG. 5, illustrating forming an imprint pattern on the substrate of FIG. 7 using the imprint method.

Referring to FIGS. 7, 8A, 8B, 8C, 8D, and 8E, a pattern 12 may be formed on a substrate 10. The pattern 12 may have a first thickness t1. Thus, a stepped portion may be formed on an upper surface of the substrate 10. The stepped portion may be formed in a cross-section along a first direction x (line I-I'). In addition, a stepped portion may also be formed in a cross-section along a second direction y which is perpendicular to the first direction x (line II-II').

A resin layer 14 may be formed on the substrate 10 on which the pattern 12 is formed. In the cross-section along the second direction y (line II-II'), the resin layer 14 may be formed in a second area C2 in which the pattern 12 is formed, and in a first area C1 and a third area C3 which are disposed adjacent to the second area C2. In the cross-section along the first direction x (line I-I'), the resin layer 14 may be formed in a second-b area C2b in which the pattern 12 is formed, and in a second-a area C2a which is adjacent to the second-b area C2b.

An imprint device which includes a press roller (200), a film 30, and a stamp 32 is provided on the substrate 10 on which the pattern 12 and the resin layer 14 are formed. The press roller 200 may include a roller body 210, an energy generating part 220 including energy generating units arranged in a matrix form, and a compensation layer 230.

In the first area C1, since there is no portion where a step is formed, imprinting can proceed in a general manner. The imprint may be performed while the substrate 10 moves in the second direction y.

Figure 8A:
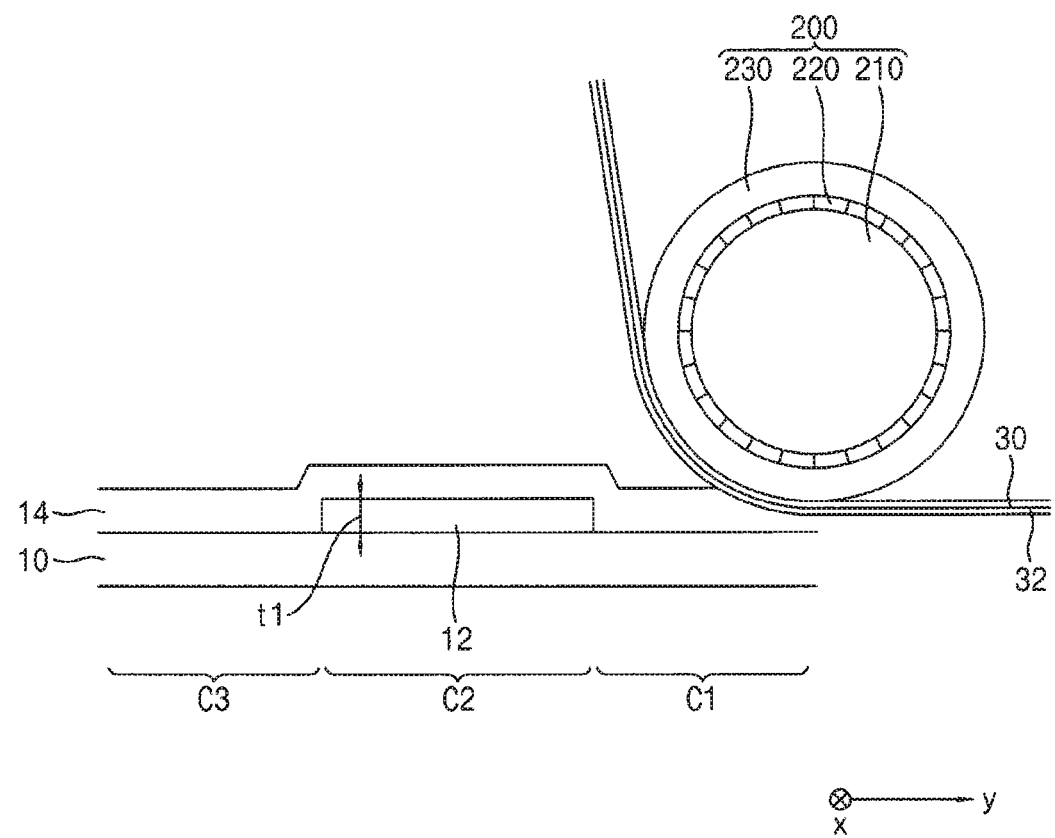
FIGS. 8A, 8B, 8C, 8D, and 8E are cross-sectional views taken along sectional lines III-III' and IV-IV' of FIG. 5 illustrating forming an imprint pattern on the substrate of FIG. 7 using the imprint method.
Figure 8B:
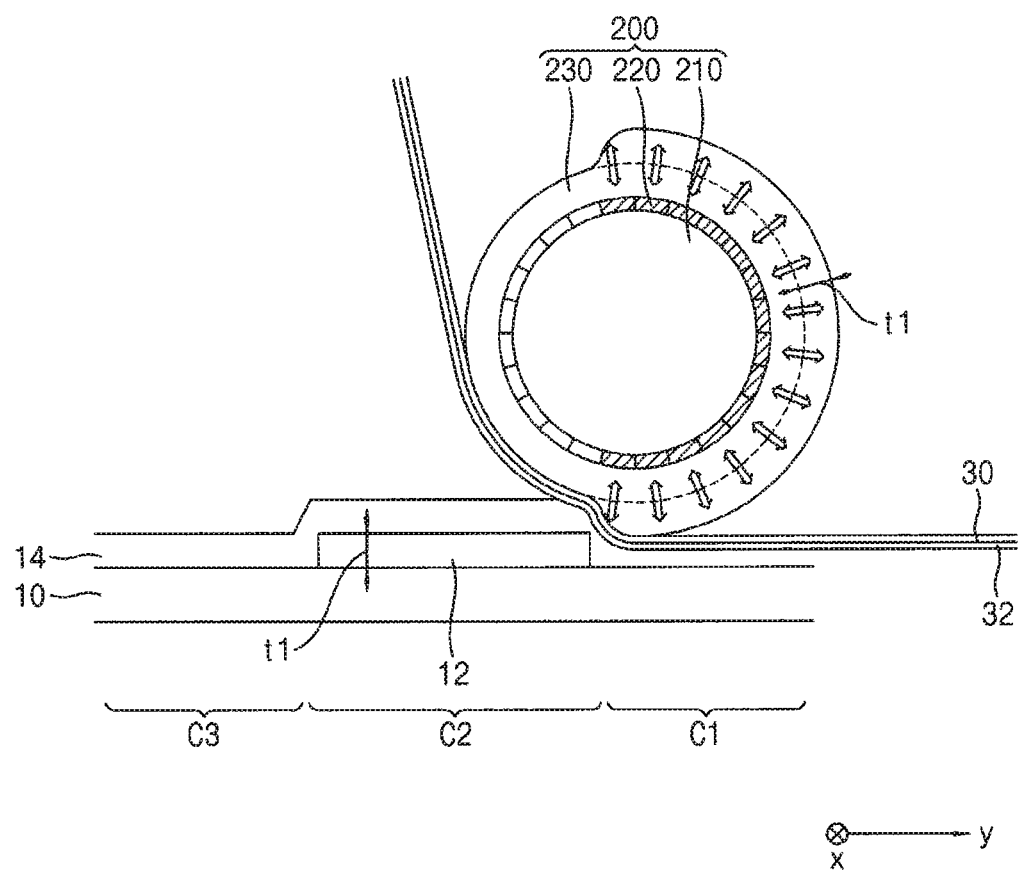
Figure 8C:
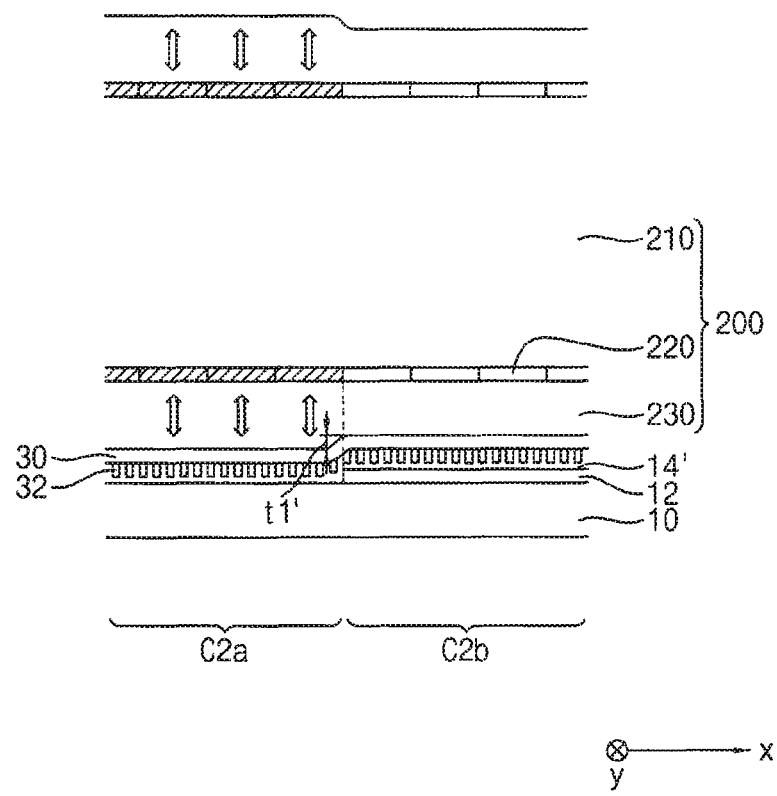

Referring to FIGS. 8B and 8C, when the press roller 200 reaches to the steppe portion at a boundary between the first area C1 and the second area C2, thickness of a portion of the compensation layer 230 corresponding to the first area C1 may be increased by controlling the energy generating units of the energy generating part 220. Here, thickness variation of the compensation layer 230 may be adjusted to be same as thickness of the pattern 12 (the first thickness t1) by controlling the energy generating units.

Here, energy generating units which make contact to a portion of the compensation layer 130 corresponding to the second area C2 may not heat up (or not generate microwave), so that thickness of the portion of the compensation layer 230 may be maintained without change.

At the same time, thickness of the compensation layer 230 corresponding to the second-b area C2b may be increased by controlling the energy generating units of the energy generating part 220.

Accordingly, the thickness of the compensation layer 230 is variously changed corresponding to both of the stepped portion in the first direction x and the stepped portion in the second direction y, so that the stamp 32 may uniformly press the resin layer 14. Accordingly, imprint defect due to the stepped portions can be minimized.

Figure 8D:
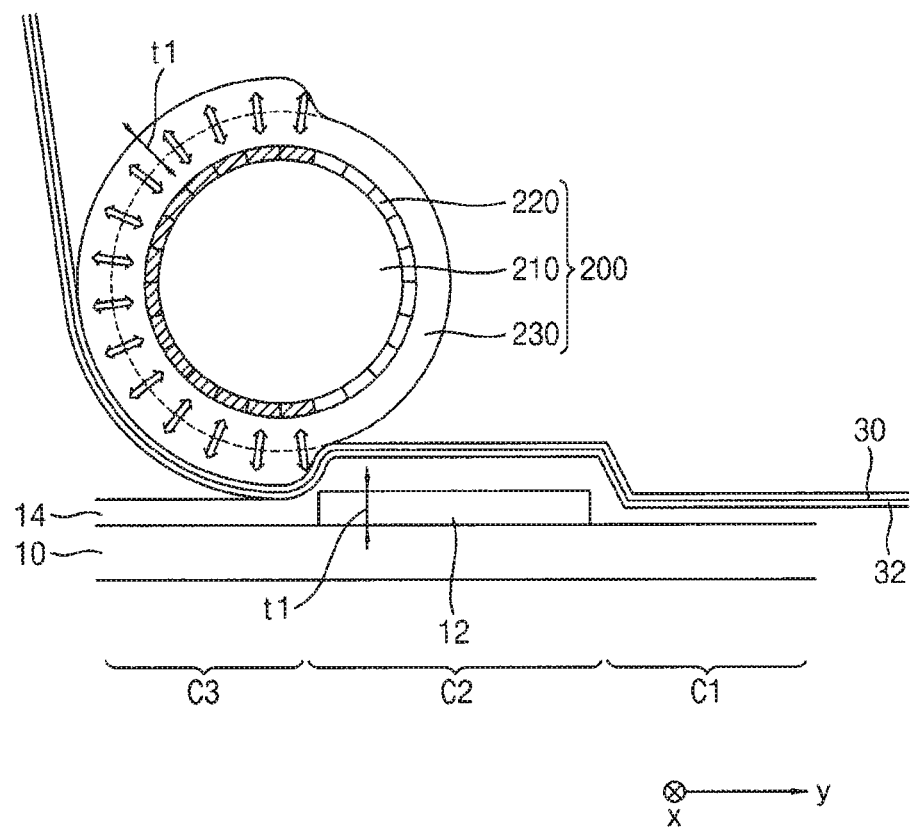

Referring to FIG. 8D, when the press roller 200 reaches to the steppe portion at a boundary between the second area C2 and the third area C3, thickness of a portion of the compensation layer 230 corresponding to the third area C3 may be increased by controlling the energy generating units of the energy generating part 220. Here, thickness variation of the compensation layer 230 may be adjusted to be same as thickness of the pattern 12 (the first thickness t1) by controlling the energy generating units.

Figure 8E:
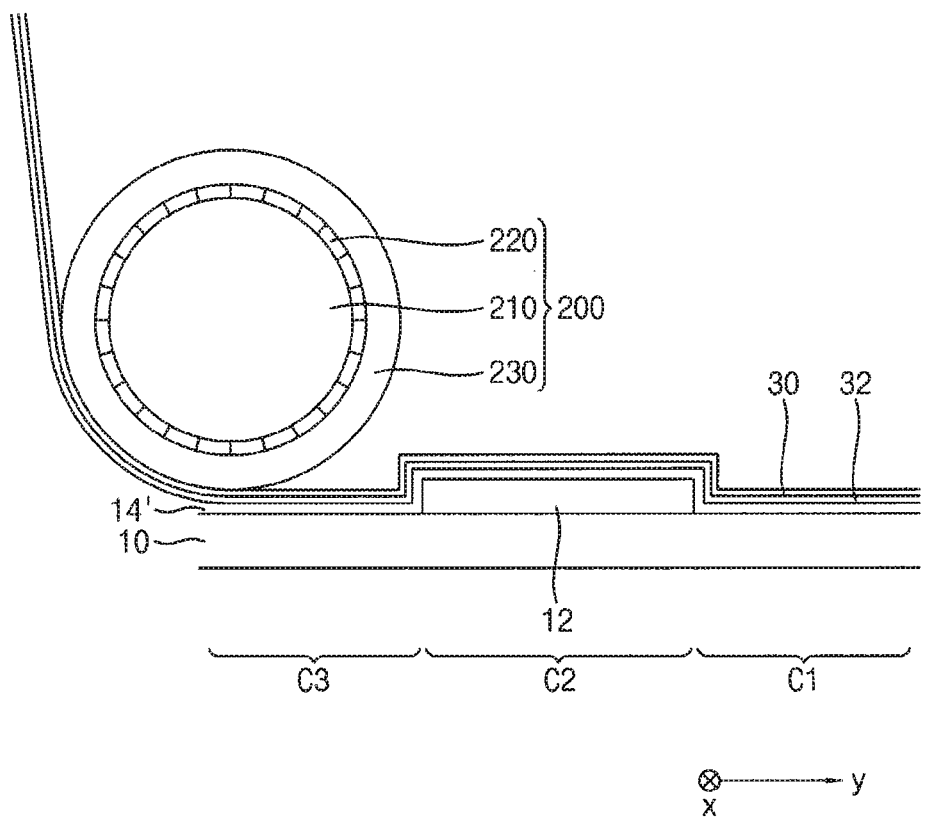

Referring to FIG. 8E, in the third area C3, since there is no portion where a step is formed, imprinting can proceed in a general manner. The imprint may be performed while the substrate 10 moves in the second direction y.

According to the present exemplary embodiment, thickness of the compensation layer 230 can vary variously with time in correspondence to the first direction x and the second direction y. Thus, even though stepped portions are formed on the substrate 10 in any direction, imprint defect due to the stepped portions can be minimized.

Figure 9:
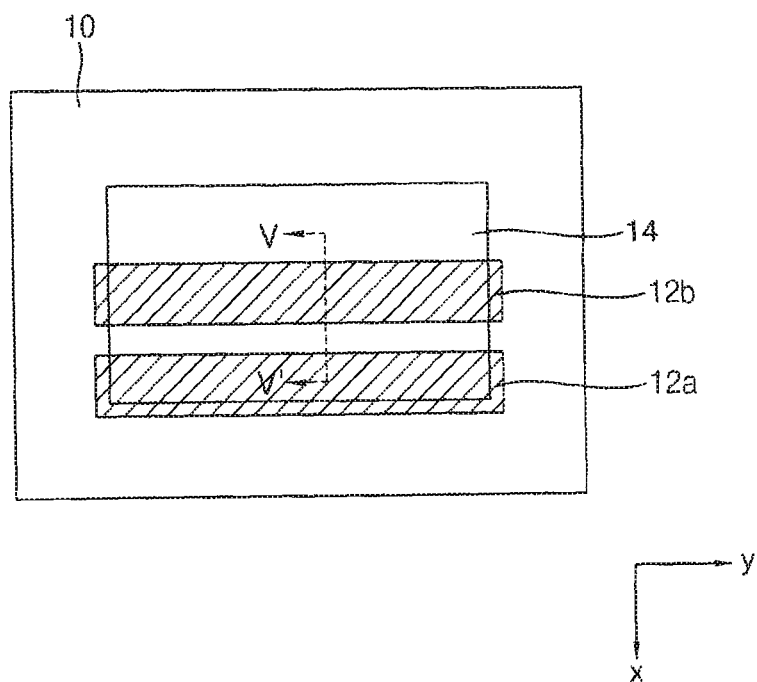
FIG. 9 is a plan view of a substrate for an imprint method according to an exemplary embodiment.
Figure 10A:
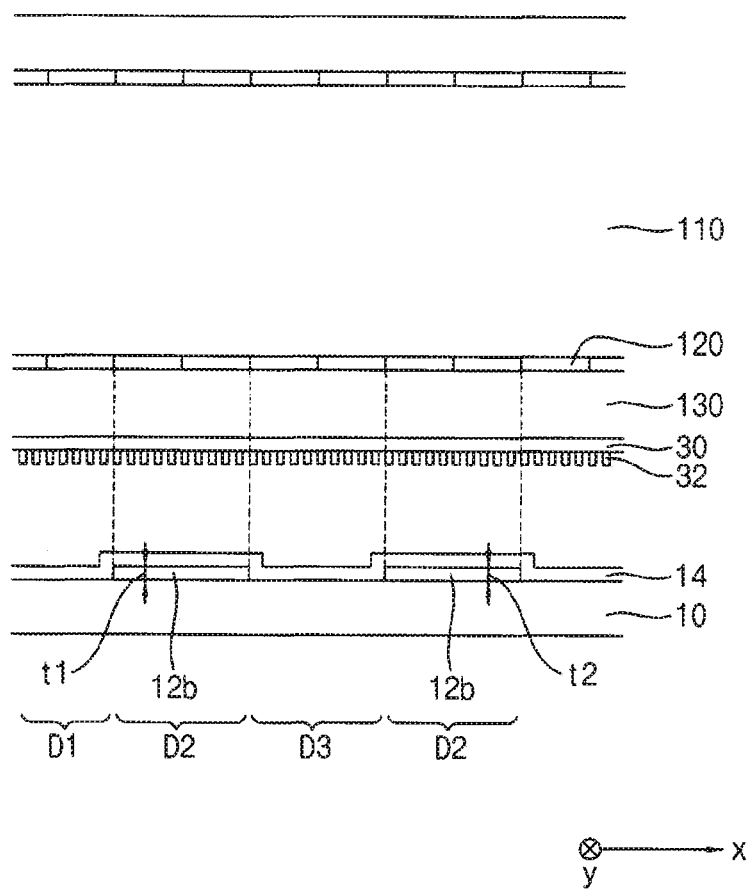
FIGS. 10A, 10B, and 10C are cross-sectional views taken along a sectional line V-V' of FIG. 9, illustrating forming an imprint pattern on the substrate of FIG. 9 using the imprint method.
Figure 10B:
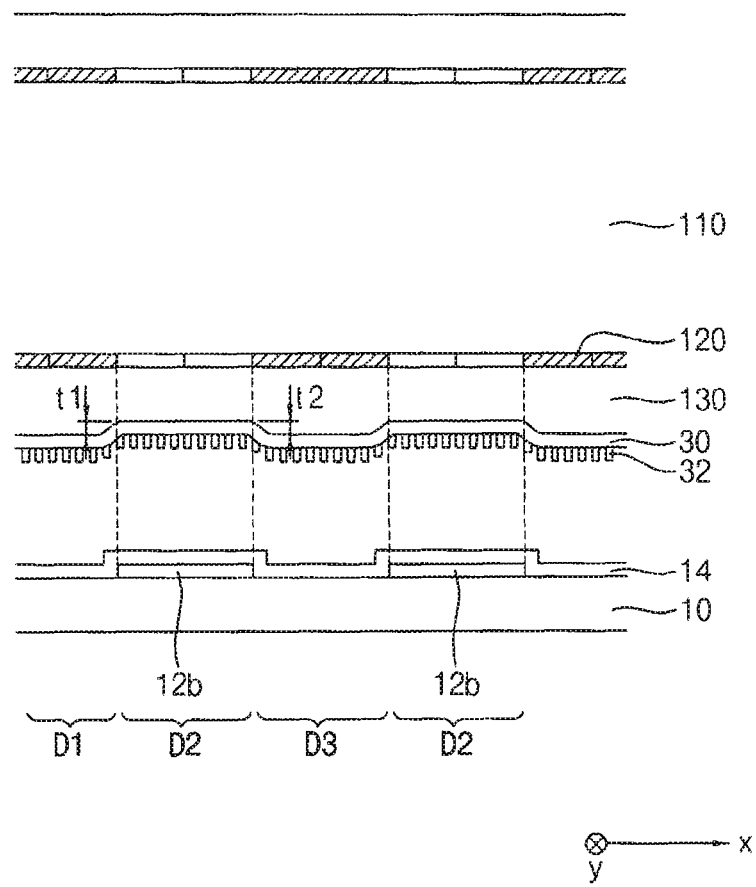
Figure 10C:
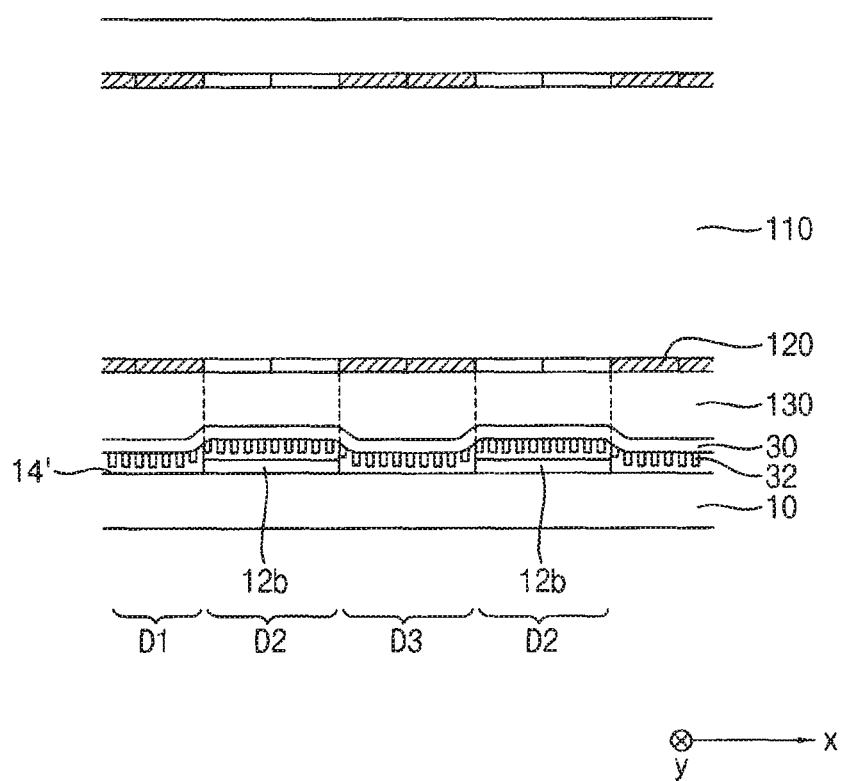

FIG. 9 is a plan view of a substrate for an imprint method according to an exemplary embodiment. FIGS. 10A, 10B, and 10C are cross-sectional views taken along a sectional line V-V' of FIG. 9, illustrating forming an imprint pattern on the substrate of FIG. 9 using the imprint method. The imprint method may be substantially the same as the imprint method of FIGS. 3, 4A, 4B, and 4C, except for a position of a stepped portion of the substrate. Thus, any further detailed descriptions concerning the same elements will be omitted.

Referring to FIGS. 9 and 10A, a pattern which includes a first pattern portion 12a and a second pattern portion 12b spaced apart from the first pattern portion 12a may be disposed on a substrate 10. The first pattern portion 12a may have a first thickness t1, and the second pattern portion 12b may have a second thickness t2. The first thickness t1 and the second thickness t2 may be formed different from each other. Accordingly, stepped portions may be formed on an upper surface of the substrate 10. A resin layer 14 may be formed on the substrate 10 on which the first and second patterns 12a and 12b are formed. The resin layer 14 may be formed in a fourth area D4, in which the first pattern portion 12a is formed, a second area D2, in which the second pattern portion 12b is formed, and in a first area D1 and a third area D3, in which the pattern is not formed.

Referring to FIG. 10B, by operating the energy generating part 120, thickness of a portion of the compensation layer 130 may be controlled. According to the exemplary embodiment, the energy generating units of the energy generating part 120 contacting to portions of the compensation layer 130 corresponding to the fourth and second areas D4 and D2 in which the first and second pattern portions 12a and 12b are formed, may not generate heat (or not generate microwave), so that the thickness of the portions of the compensation layer 130 corresponding to the fourth and second areas D4 and D2 may be maintained without changing. Also, energy generating units of the energy generating part 120 (shaded areas on the picture) which correspond to portions of the compensation layer 130 that are corresponding to the first area D1 and the third area D3 in which the pattern is not formed, may generate heat (or generate microwave), so that the heat or energy may be provided to the portions of the compensation layer 130. Accordingly, thickness of the portion of the compensation layer 130 in the first area D1 may be increased by the first thickness t1, and thickness of the portion of the compensation layer 130 in the third area D3 may be increased by the second thickness t2.

Referring to FIG. 10C, an imprint pattern may be imprinted onto the resin layer 14 by pressing the stamp 32 onto the resin layer 14 using the press roller 100.

Here, the thickness of the compensation layer 130 is variously changed corresponding to the stepped portions on the substrate 10, so that the stamp 32 may uniformly press the resin layer 14. Accordingly, imprint defect that may occur due to the stepped portions at a boundary between the first area D1 and the second area D2, at a boundary between the second area D2 and the third area D3, and at a boundary between the third area D3 and the fourth area D4 can be minimized or reduced.

According to the exemplary embodiments of the present inventive concepts, a press roller for an imprint method includes an energy generating part including a plurality of energy generating units, and a compensation layer disposed on the energy generating part. The compensation layer includes a material that expands in volume when heat or energy is applied. Here, thickness of the compensation layer may be controlled corresponding to a stepped portion on the substrate, so that a stamp may uniformly press a resin layer. Also, each of the plurality of energy generating units may be individually controlled. Accordingly, imprint defect due to the stepped portion can be minimized or reduced.

In addition, the energy generating units of the energy generating part of the press roller are arranged in a first direction or in a matrix form, and the energy generating units are individually controlled, so that the thickness of the compensation layer may be variously changed depending on location and time. Thus, imprint quality may be improved even a substrate has various forms of stepped portions.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A press roller for an imprint method, the press roller comprising:
   a roller body having a cylindrical shape extending in a first direction;
   an energy generating part disposed on a curved surface of the roller body, the energy generating part comprising a plurality of energy generating units configured to be individually controlled to emit energy; and
   a compensation layer disposed on the energy generating part, the compensation layer comprising a material that expands in volume when the energy is applied,
   wherein the compensation layer comprises a first polymeric binder and a second polymeric binder, and
   wherein a first glass transition temperature of the first polymeric binder is at least 20 centigrade degrees higher than a second glass transition temperature of the second polymeric binder.

2. The press roller of claim 1, wherein the first polymeric binder comprises at least one selected from a group consisting of polystyrene and copolymers thereof, acrylates, methacrylates and copolymers thereof, and
   wherein the second polymeric binder comprises at least one selected from a group consisting of butyl acrylates and copolymers thereof.

3. The press roller of claim 1, wherein the plurality of energy generating units are configured to generate heat or microwave.

4. The press roller of claim 3, wherein the plurality of energy generating units are arranged in the first direction, and
   wherein each of the plurality of energy generating units extends along the curved surface in a second direction perpendicular to the first direction.

5. The press roller of claim 3, wherein each of the plurality of energy generating units are arranged in a matrix form on the curved surface in the first direction and a direction perpendicular to the first direction.

6. The press roller of claim 1, further comprising a protecting layer disposed on the compensation layer to protect the compensation layer.

7. An imprint method, comprising:
   providing a substrate comprising a pattern disposed thereon, the substrate having a stepped portion in an upper surface formed by the pattern;
   disposing a resin layer on the substrate;
   providing a press roller, a film, and a stamp disposed on the film, the press roller comprising a roller body having a cylindrical shape extending in a first direction, an energy generating part disposed on a curved surface of the roller body, and a compensation layer disposed on the energy generating part, wherein the energy generating part comprises a plurality of energy generating units configured to be individually controlled to emit energy and the compensation layer comprises material that expands in volume when the energy is applied;
   controlling a thickness of a portion of the compensation layer by operating the plurality of energy generating units;
   forming an imprint pattern by pressing the stamp onto the resin layer using the press roller; and
   separating the stamp from the resin layer.

8. The imprint method of claim 7, wherein the compensation layer comprises a first polymeric binder and a second polymeric binder, and
   wherein a first glass transition temperature of the first polymeric binder is at least 20 centigrade degrees higher than a second glass transition temperature of the second polymeric binder.

9. The imprint method of claim 8, wherein the first polymeric binder comprises at least one selected from a group consisting of polystyrene and copolymers thereof, acrylates, methacrylates and co-polymers thereof, and
   wherein the second polymeric binder comprises at least one selected from a group consisting of butyl acrylates and co-polymers thereof.

10. The imprint method of claim 9, wherein the plurality of energy generating units are arranged in the first direction, and
    wherein each of the plurality of energy generating units extends along the curved surface in a second direction perpendicular to the first direction.

11. The imprint method of claim 10, wherein the stepped portion of the substrate extends in the second direction.

12. The imprint method of claim 11, wherein the substrate comprises a first area in which the pattern is not formed, and a second area in which the pattern is formed, and wherein the pattern has a first thickness, wherein the controlling the thickness of the portion of the compensation layer comprises:

controlling a thickness of a first portion of the compensation layer corresponding to the first area to be thicker by the first thickness than a thickness of a second portion of the compensation layer corresponding to the second area.

13. The imprint method of claim 12, wherein the substrate further comprises a third area in which the pattern is not formed, the second area is disposed between the first area and the third area, wherein the controlling the thickness of the portion of the compensation layer further comprises:

controlling a thickness of a third portion of the compensation layer corresponding to the third area to be thicker by the first thickness than the thickness of the second portion of the compensation layer corresponding to the second and third area.

14. The imprint method of claim 8, wherein the plurality of energy generating units are arranged in a matrix form on the curved surface in the first direction and a second direction perpendicular to the first direction.

15. The imprint method of claim 14, wherein the stepped portion extends in the first direction.

16. The imprint method of claim 7, wherein the substrate comprises a first area in which the pattern is not formed, and a second area in which the pattern is formed, and wherein the pattern has a first thickness, wherein the controlling the thickness of the portion of the compensation layer comprises:

controlling a thickness of a first portion of the compensation layer corresponding to the first area to be thicker by the first thickness than a thickness of a second portion of the compensation layer corresponding to the second area.

17. The imprint method of claim 7, wherein the pattern comprises a first pattern portion having a first thickness, and a second pattern portion having a second thickness, wherein the controlling the thickness of the portion of the compensation layer comprises:

controlling the compensation layer to have various thicknesses corresponding to the stepped portion formed by the first pattern portion and the second pattern portion.

18. An imprint method, comprising:

disposing a resin layer on a substrate, the resin layer comprising a pattern forming a stepped portion on a upper surface of the substrate;

forming an imprint pattern on the resin layer by pressing a stamp disposed on a film using a press roller, wherein the press roller comprises an energy generating part comprising a plurality of energy generating units configured to be individually controlled, and a compensation layer disposed on the energy generating part, the compensation layer comprising a material that expands in volume when energy is applied; and controlling a thickness of at least a portion of the compensation layer to have various thicknesses corresponding to the stepped portion formed by the pattern.

* * * * *